United States Patent [19]

Koike

[11] Patent Number: 5,229,629
[45] Date of Patent: Jul. 20, 1993

[54] SEMICONDUCTOR INTEGRATED CIRCUIT HAVING IMPROVED CELL LAYOUT

[75] Inventor: Mitsuhiro Koike, Yokohama, Japan

[73] Assignee: Kabushiki Kaisha Toshiba, Kawasaki, Japan

[21] Appl. No.: 740,894

[22] Filed: Aug. 6, 1991

[30] Foreign Application Priority Data

Aug. 10, 1990 [JP] Japan .................................. 2-213157

[51] Int. Cl.⁵ ............................................ H01L 27/02
[52] U.S. Cl. .................................... 257/211; 257/202; 257/208
[58] Field of Search .................. 357/40; 257/202, 203, 257/207, 208, 211

[56] References Cited

U.S. PATENT DOCUMENTS 5,095,356 3/1992 Ando et al. ......................... 257/202

FOREIGN PATENT DOCUMENTS

61-229341 7/1986 Japan .
62-291136 8/1987 Japan .

*Primary Examiner*—James W. Davie
*Attorney, Agent, or Firm*—Finnegan, Henderson, Farabow, Garrett & Dunner

[57] ABSTRACT

A plurality of cells include standard circuits having no power source line and no ground line and having signal terminals supplied with signals and power source terminals connected to a power source. Each of the cells is rotated in a desired direction and placed so as to reduce to a minimum the distance between the terminals of said cells and the corresponding terminals of another cell connected to those of the former cell and the cells are arranged in contact with each other. A plurality of wiring layers are arranged to connect the signal terminals of the cells together and the power source terminals thereof together. The wiring layers are insulated from the cells and placed above the cells.

10 Claims, 6 Drawing Sheets

SEMICONDUCTOR INTEGRATED CIRCUIT HAVING IMPROVED CELL LAYOUT

BACKGROUND OF THE INVENTION

1. Field of the Invention

This invention relates to a standard cell type semiconductor integrated circuit in which an LSI having desired functions is designed by combining standard cells such as inverter circuits, AND circuits and OR circuits, and particularly to the placement of a plurality of cells and the wiring between the cells.

2. Description of the Related Art

Recently, a poly-cell layout system in which a function block having a desired function is constructed by combining standard cells such as inverter circuits, AND circuits and OR circuits by use of the computer-aided design (CAD) has been developed.

Figure 9:
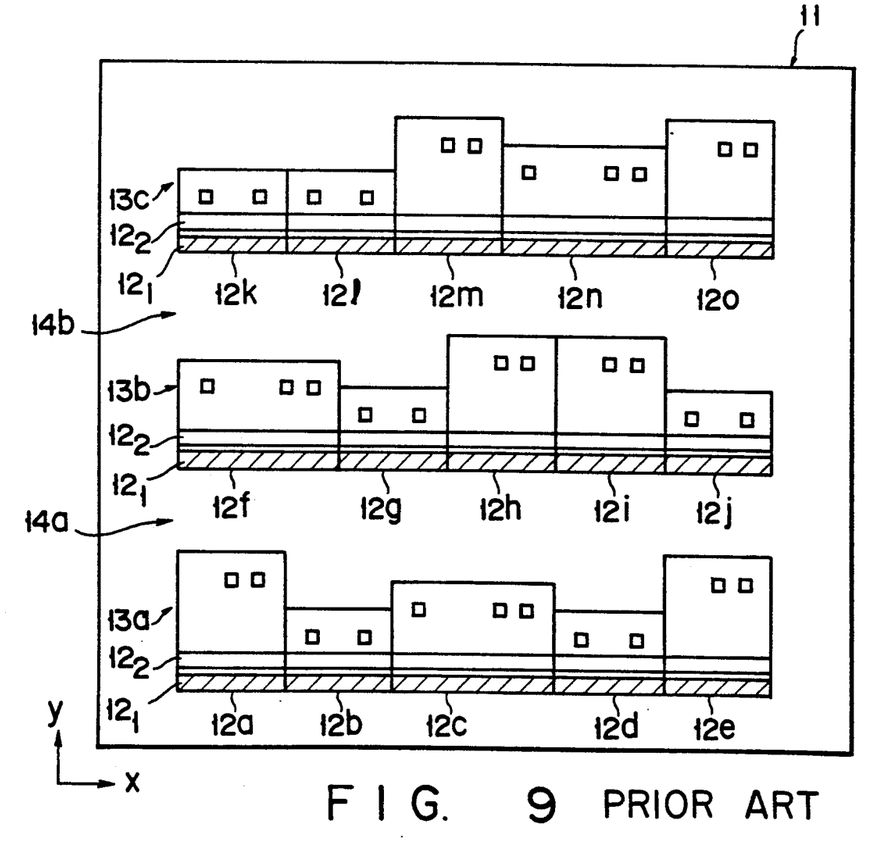
FIG. 9 is a construction view showing the conventional cell layout system.

FIG. 9 shows the poly-cell layout. In this layout, a plurality of standard cells (which are hereinafter simply referred to as cells) $12a$, $12b$, - - -, $12e$ are placed in an X direction to form a cell row $13a$ on a substrate 11. A power source line $12_1$, ground line $12_2$ and signal terminals $12_3$ are provided for each of the cells $12a$, $12b$, - - -, $12e$, and the power source lines $12_1$ and ground lines $12_2$ of the cells are shown to be automatically connected in a continuous form when the cells $12a$, $12b$, - - -, $12e$ are placed. Likewise, on the substrate 11, cell rows $13b$ and $13c$ are paced in positions apart from the cell row $13a$ by preset distances in a y direction. The cell row $13b$ is constructed by cells $12f$, $12g$, - - -, $12j$ and the cell row $13c$ is constructed by cells $12k$, $12l$, - - -, $12o$. Also, a power source line $12_1$, ground line $12_2$ and signal terminals $12_3$ are previously provided for each of the cells $12f$ to $12o$.

An area between the cell rows $13a$ and $13b$ is defined as a first wiring area $14a$ and an area between the cell rows $13b$ and $13c$ is defined as a second wiring area $14b$. The respective cells are interconnected by use of the first and second wiring areas $14a$ and $14b$.

Figure 10:
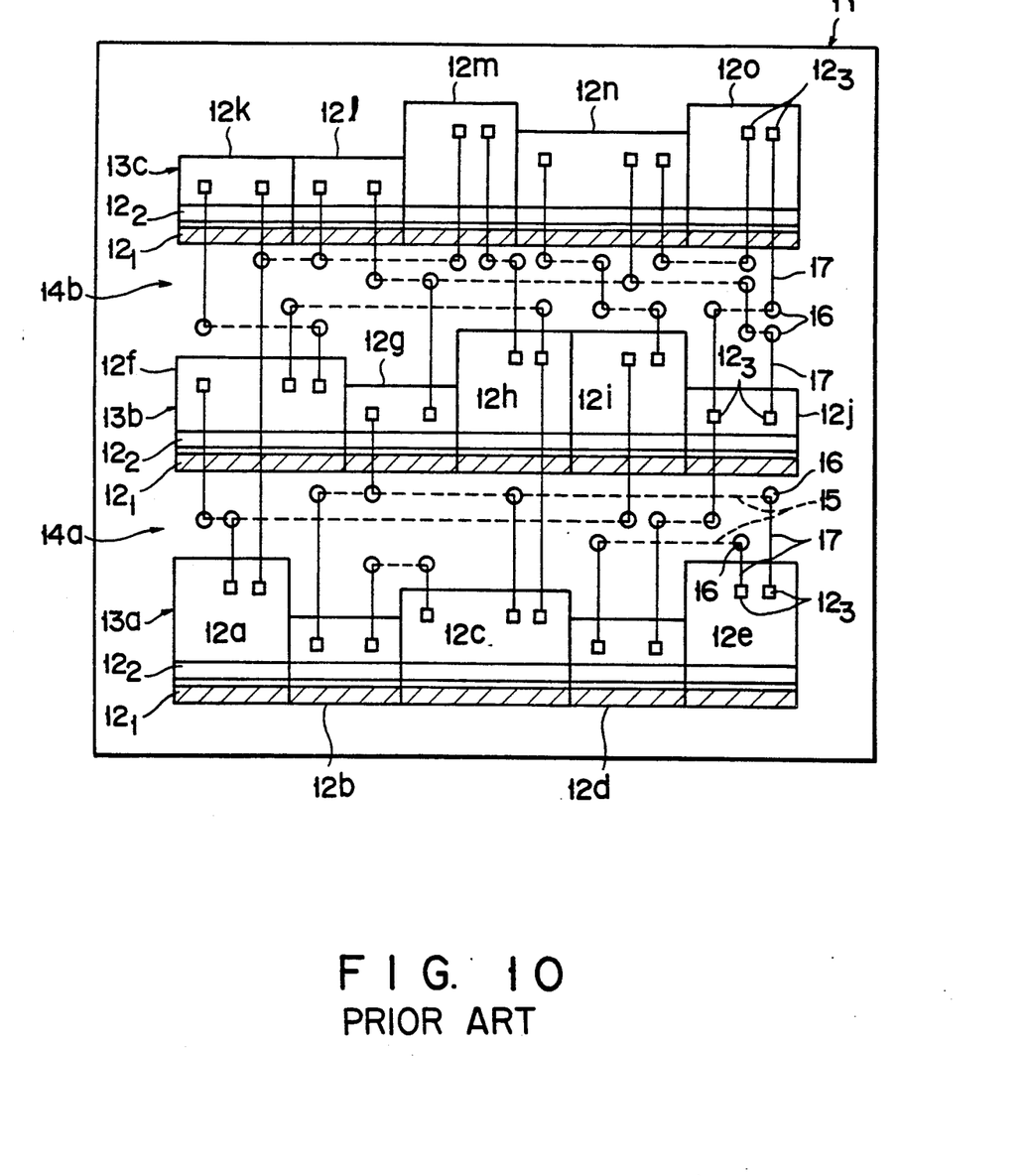
FIG. 10 is a construction view showing a structure obtained by forming wiring layers on the structure of FIG. 9.

FIG. 10 shows interconnections between the cells $12a$ to $12o$ and between the cell rows $13a$ to $13c$. That is, first layer metal wirings 15 indicated by broken lines are formed in the first and second wiring areas $14a$ and $14b$. An insulative layer (not shown) is formed on the first metal wiring layers 15, and second layer metal wirings 17 indicated by solid lines are formed on the insulative layer. The first layer metal wirings 15 are selectively connected to the second layer metal wirings 17 through respective through holes 16 formed on the insulative layer. The second layer metal wirings 17 are connected to the signal terminals $12_3$ formed on the respective cells 12. Further, the power source lines $12_1$ of the cell rows $13a$ to $13c$ are connected together in the peripheral area of the substrate 11 and the ground lines $12_2$ thereof are also connected together in the peripheral area.

Figure 11:
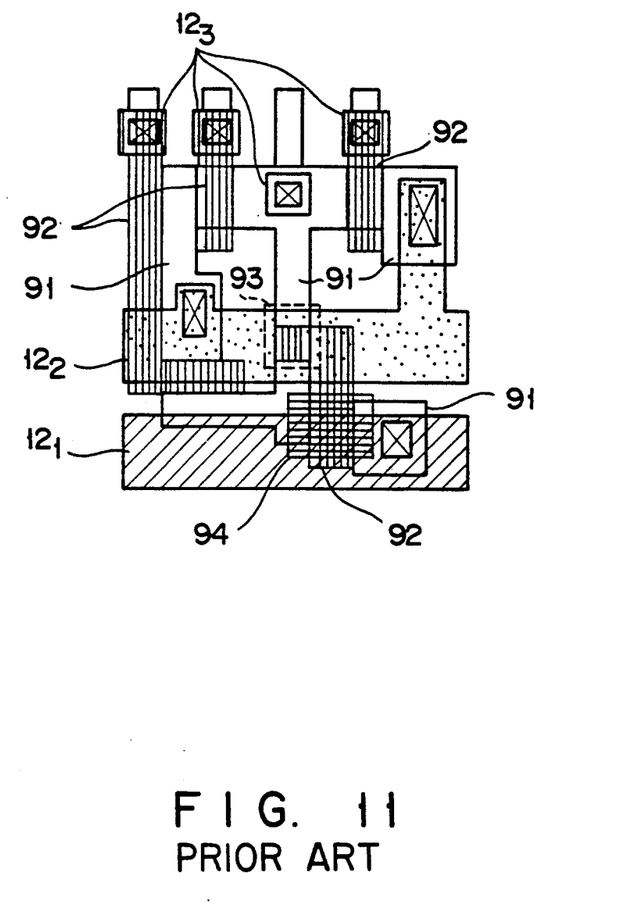
FIG. 11 is a layout diagram showing an example of the conventional standard cell.

FIG. 11 shows an example of the cell 12 used in the poly-cell layout, and portions which are the same as those of FIGS. 9 and 10 are denoted by the same reference numerals.

In the cell 12, the positions of the power source line $12_1$ and the ground line $12_2$ are predetermined and the signal terminals $12_3$ are arranged on an area excluding the power source line $12_1$ and ground line $12_2$. In FIG. 11, 91 denotes diffused layers, 92 polysilicon layers, 93 a buried contact, and 94 a position in which impurity ions for forming a depletion type transistor are implanted.

As shown in FIGS. 9 and 10, useless areas may occur in the wiring areas between the cell rows when higher cells and lower cells are placed.

Further, it is necessary to connect the power source lines which are previously provided for the respective cells together and the ground lines which are previously provided for the respective cells together, the rotation of the cells is limited by the power source lines and ground lines. Therefore, when the cells are connected to each other, some wiring lines must take a roundabout way and it is difficult to connect the cells to each other in the shortest way.

In principle, the widths of the power source line and ground line previously provided for each of the cells may be sufficient only if the power source line and ground line can pass a dissipating current of the cell. That is, in a case of the cell row $13a$ shown in FIGS. 9 and 10, the widths of the power source line and ground line of the cell $12e$ can be made smaller than those of the cell $12a$ when a current is supplied from the side of the cell $12a$. However, the widths of the power source line and ground line of each cell are so determined that the power source line and ground line can pass a current for the whole portion of one cell row. Therefore, areas occupied by the power source line and ground line are large and it is difficult to reduce the size of the cell itself.

SUMMARY OF THE INVENTION

An object of this invention is to provide a semiconductor integrated circuit in which useless areas in the cell and between the cells can be reduced and the length of wirings for connecting the cells to each other can be reduced.

The above object can be attained by a semiconductor integrated circuit including a plurality of cells having standard circuits constructed by semiconductor elements to constitute a desired circuit, comprising:

a plurality of cells including standard circuits having signal terminals supplied with signals and power source terminals connected to a power source, each of the cells being rotated in a desired direction and disposed so as to reduce the distance between the terminals of said cells and the corresponding terminals of another cell connected to those of the former cell to a minimum; and a plurality of wiring layers for selectively connecting the signal terminals together and the power source terminals together, the wiring layers being insulated from the cells and formed above the cells.

According to preferred embodiments of this invention, the cell having the signal terminals and power source terminal is rotated in a desired direction and placed to reduce the distance between the signal terminals and power source terminal thereof and the signal terminals and power source terminal of another cell connected to those of the former cell to a minimum. Thus, unlike the conventional case, since it is not necessary to place their cells with the power source lines aligned, cells of different shapes can be placed in desired directions and useless areas can be reduced.

Further, since the lengths of the wirings for connecting the cells to each other can be reduced, the circuit operation speed can be enhanced.

In addition, the signal terminals are connected to one another by means of a plurality of wiring layers for connecting the cells with one another and the power source terminals are connected together by the wiring layers. Therefore, the conventional wiring areas are not necessary and useless areas can be reduced.

Each cell has signal terminals for receiving and outputting signals, and power source terminals connected to power sources but has no power source lines. Therefore, the size of the cell itself can be reduced.

Further, since the power source terminals are connected to each other by means of the wiring layer, the widths of the wiring layers connecting the power source terminals to each other can be determined according to the amount of current.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

There will now be described an embodiment of this invention with reference to the accompanying drawings.

Figure 1:
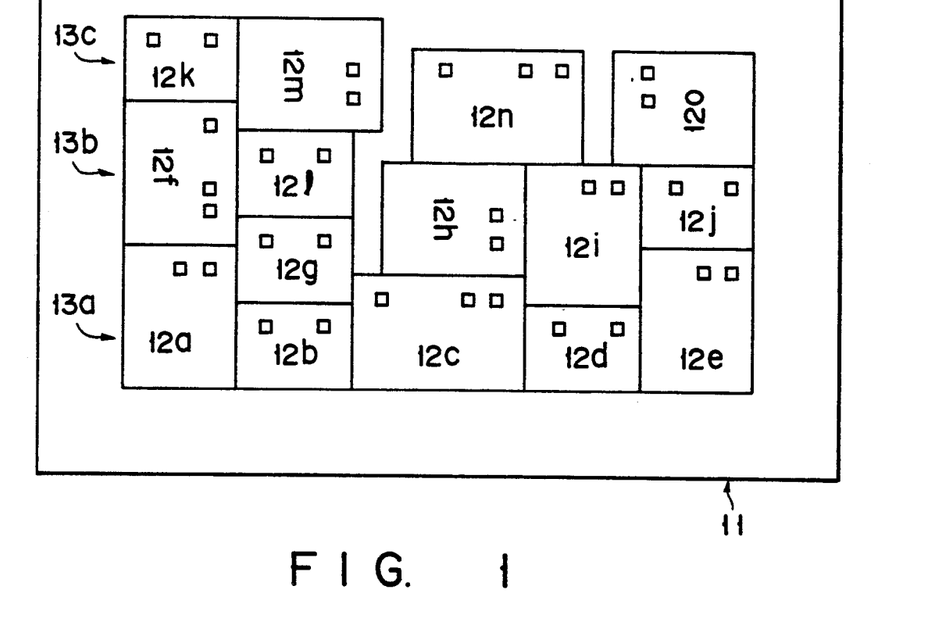
FIG. 1 is a construction view showing a first embodiment of this invention.

FIG. 1 shows a cell arrangement of this invention. The cell arrangement can be attained by arranging cells having the same shapes as those of FIGS. 9 and 10, and the cells of the same shapes are denoted by the same reference numerals.

In FIG. 1, the cell position and the direction of the cell arrangement of the cell row 13a are the same as those of the cell row 13a shown in FIGS. 9 and 10. However, in FIG. 1, the cells 12f to 12j constituting the cell row 13b are placed in contact with the cells 12a to 12e constituting the cell row 13a, respectively. In this case, the cell 12g is partly surrounded by the cells 12a, 12b and 12c, and the cell 12i is partly surrounded by the cells 12c, 12d and 12e. Further, the cells 12f and 12h are rotated by 90° in a clockwise direction with respect to those shown in FIGS. 9 and 10.

Likewise, the cell row 13c is placed in contact with the cell row 13b. The cell 12l is partly surrounded by the cells 12f, 12g and 12m and the cell 12m is rotated by 90° in a clockwise direction. Further, the cell 12o is rotated by 90° in a counter clockwise direction and placed in contact with the cells 12i and 12j.

The rotation direction of the cell is determined according to the length of a wiring for connecting the cells to each other and the cell is rotated in such a direction as to reduce the wiring length to a minimum. The algorithm for determining the direction of the cell rotation is well known in the CAD and therefore the explanation thereof is omitted.

Figure 2:
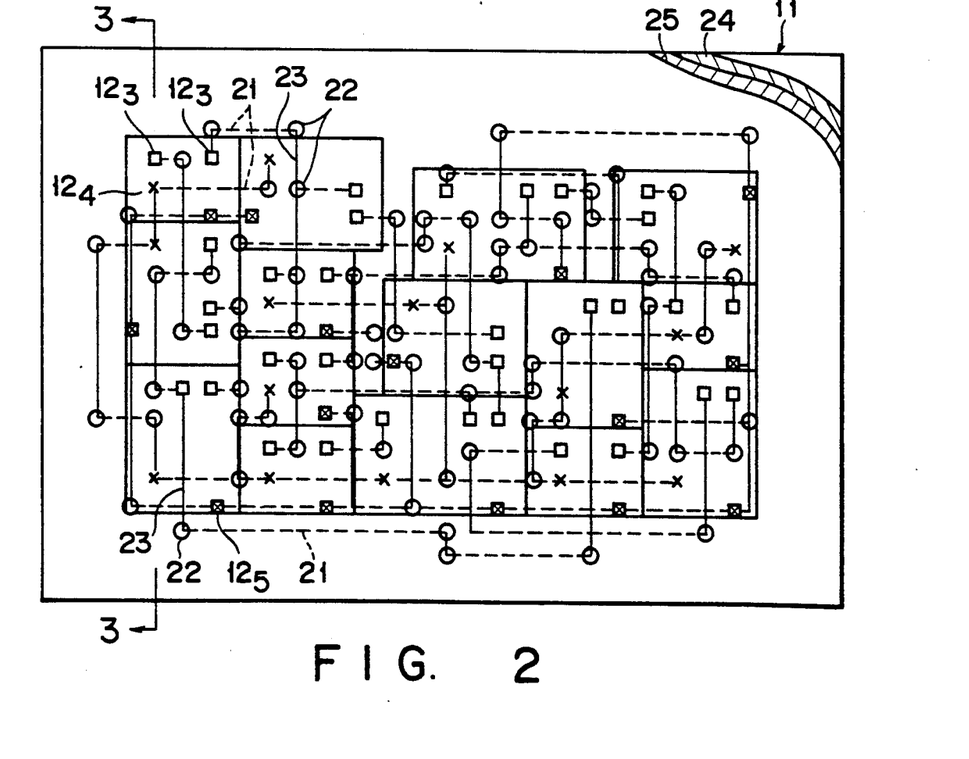
FIG. 2 is a construction view showing a structure obtained by forming wiring layers on the structure of FIG. 1.
Figure 3:
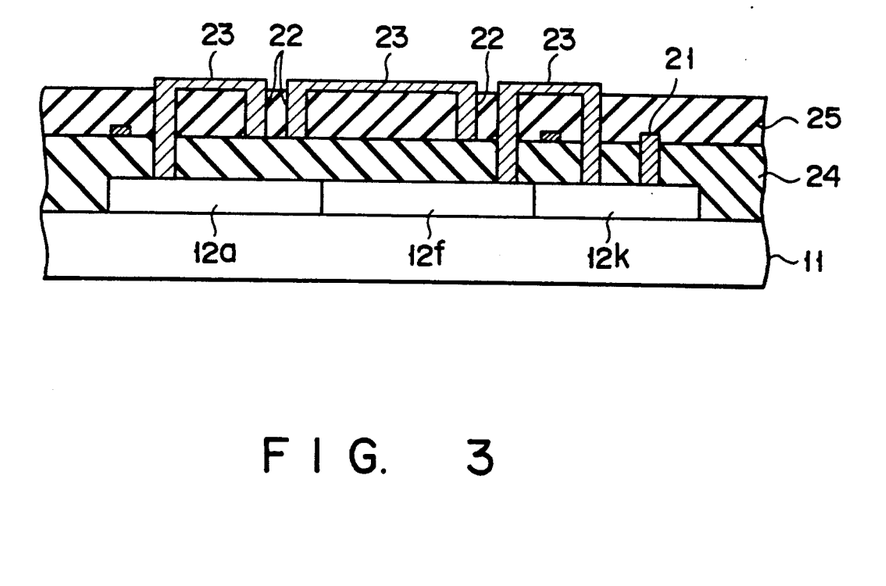
FIG. 3 is a cross sectional view taken along the line 3—3 of FIG. 2.

FIGS. 2 and 3 show a structure obtained by forming wirings on the cell array of FIG. 1. A first insulative layer 24 is formed on the cells 12a to 12o and first layer metal wirings 21 indicated by broken lines are formed on the first insulative layer 24. The first layer metal wirings 21 are selectively connected to signal terminals $12_3$ indicated by a □ mark, ground terminals $12_4$ indicated by a X mark, or power source terminals $12_5$ indicated by a symbol of a combination of the □ mark and X mark.

A second insulative layer 25 is formed on the first metal wiring layer 21 and the first insulative layer 24 and through holes 22 indicated by a o mark are formed in the second insulative layer 25. Second layer metal wirings 23 indicated by solid lines are formed on the second insulative layer 25 and the second layer metal wirings 25 are selectively connected to the first layer metal wirings 21 via the through holes 22. The second layer metal wirings 23 are selectively connected to the signal terminals $12_3$ and the like formed on the respective cells 12a to 12o. That is, the signal terminals $12_3$, ground terminals $12_4$ and power source terminals $12_5$ permit the first layer metal wirings 21 and the second layer metal wirings 23 to be connected to each other.

Figure 4:
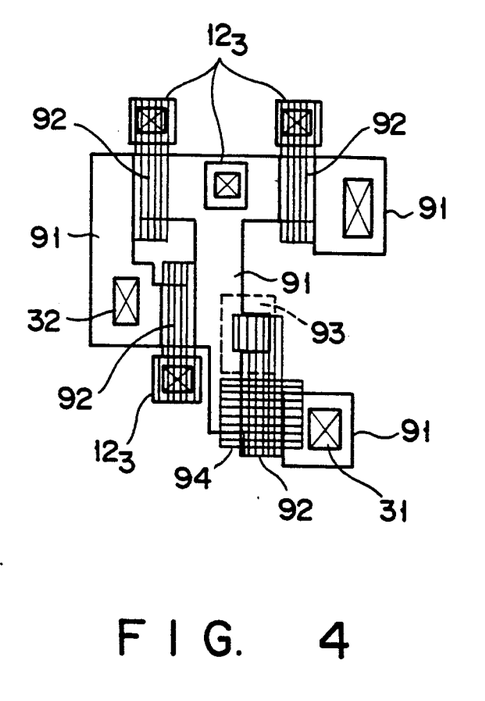
FIG. 4 is a layout diagram showing an example of a standard cell applied to this invention.

FIG. 4 shows an example of the cell used in the above embodiment. The cell can be obtained by omitting the power source terminal $12_1$ and ground terminal $12_2$ from the cell of FIG. 11 and partly modifying the cell of FIG. 11, and a power source line contact hole 31 and a ground line contact hole 32 are formed in the cell. The positions of the signal terminals $12_3$, power source line contact hole 31 and ground line contact hole 32 can be changed as required.

According to the above embodiment, the cell rows 13a, 13b and 13c are placed in contact with each other. Therefore, the wiring area can be reduced in comparison with that of the conventional case. Further, unlike the conventional case, the arrangement of the cells is not limited by the power source line and ground line and the cells can be rotated in a desired direction and placed in the rotated position. Therefore, the area of the function block constituted by a plurality of cells can be reduced.

The area may be dependent on the construction of the function block, but in the case of the construction of FIGS. 1 and 2, the area can be reduced by 30% in comparison with the construction of FIGS. 9 and 10. Therefore, function blocks of an amount increased by 30% can be taken out from the same wafer, the manufacturing yield can be enhanced and the manufacturing cost can be reduced by substantially 30% or more.

Further, the cell rows 13a, 13b and 13c can be arranged in contact with each other and the cells can be rotated and placed in the rotated position so as to reduce the wiring distance to a minimum. Since the operation speed of a transistor is limited by the capacitance of the wiring, the operation speed of the transistor can be enhanced by reducing the wiring length.

In the above embodiment, the wiring length can be reduced by 20% in comparison with that of the conventional case. Accordingly, the operation speed of the wiring can be enhanced by approx. 20%.

Since each cell has no power source line and no ground line, the area of the cell itself can be reduced. In FIG. 4, the structure which can be obtained by omitting the power source line and ground line from the structure of FIG. 11 is shown, but the area of each cell can be further reduced by designing the cell itself according to this invention.

Further, in this embodiment, the power source line and ground line are not previously provided for each cell and the power source line and ground line can be freely formed with the shortest wiring distance. Recently, the CAD performance is enhanced and the width of the wiring can be changed according to the amount of current. Therefore, in the function block, the area occupied by the power source line and ground line can be significantly reduced in comparison with that of the conventional case.

Figure 5:
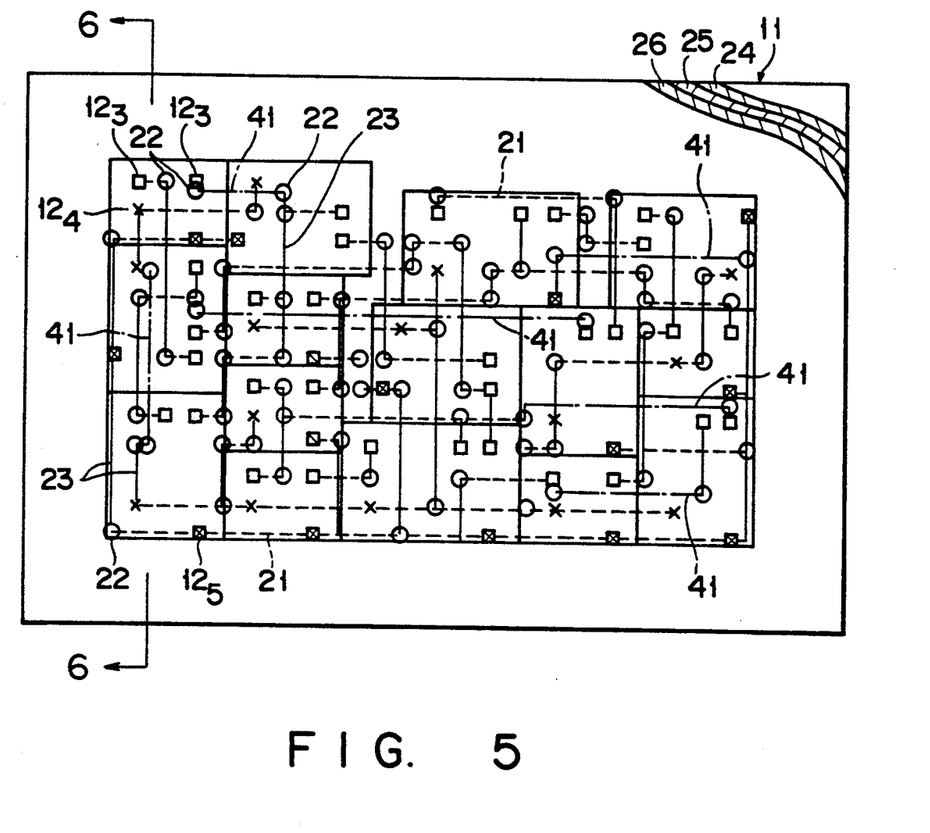
FIG. 5 is a construction view showing a second embodiment of this invention.
Figure 6:
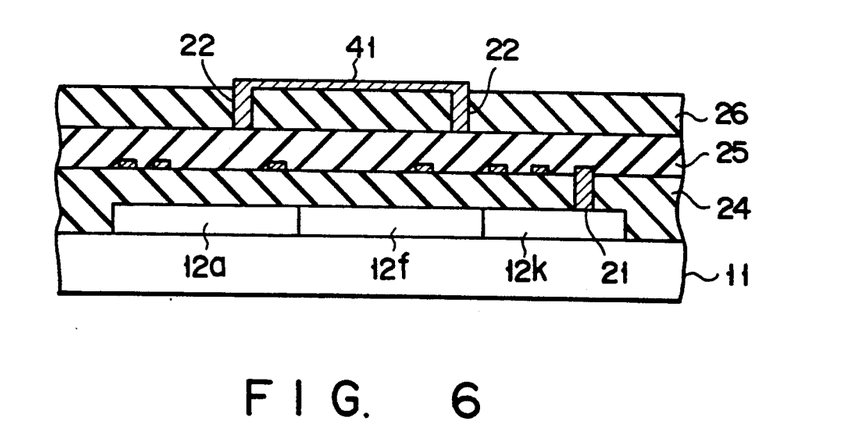
FIG. 6 is a cross sectional view taken along the line 6—6 of FIG. 5.

Next, a second embodiment of this invention is explained. FIGS. 5 and 6 show the second embodiment and portions which are the same as those of FIGS. 1 and 2 are denoted by the same reference numerals.

In the first embodiment, the first and second layer metal wirings 21 and 23 are used, but in the second embodiment, third layer metal wirings 41 indicated by one-dot-dash lines are additionally used. That is, as shown in FIGS. 5 and 6, a third insulative layer 26 is formed on the second metal layers 23 and second insulative layer 25 and the third layer metal wirings 41 are formed on the third insulative layer 26. The third layer metal wirings 41 are selectively connected to the first and second layer metal wirings 21 and 23 via through holes 22 formed in the third insulative layer 26 or through holes 22 formed in the second and third insulative layers 25 and 26. Thus, the entire wiring can be attained above the cell rows by using the third layer metal wirings 41. Therefore, the area can be further reduced.

Figure 7:
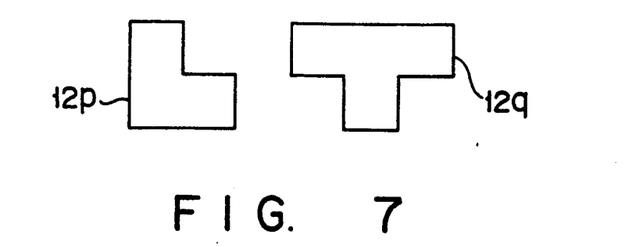
FIG. 7 is a diagram showing the modifications of the cell.
Figure 8:
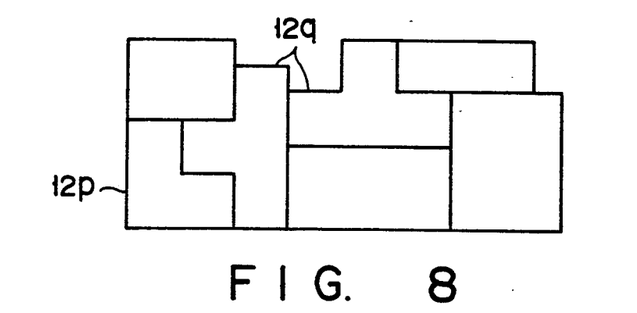
FIG. 8 is a construction view showing a structure formed by arranging the cells having the same construction as that of FIG. 7.

In the above embodiments, the cell is formed in a rectangular form, but it is not limited to the rectangular form. For example, as shown in FIG. 7, cells 12p and 12q can be respectively formed in "letter-L" and "letter-T" shapes and placed as shown in FIG. 8 to attain the same effect as in the above embodiments.

Further, this invention can be variously modified without departing from the technical scope thereof.

I claim:

1. A semiconductor integrated circuit comprising:
a semiconductor substrate;
a plurality of cells, each cell including standard circuits having no power source line and no ground line and having a signal terminal coupled to a signal terminal of another cell, and power source terminals connected to a power source, each cell being oriented and located to reduce a distance between the signal terminal and the signal terminal of the other cell, wherein a first cell is oriented in a first direction and a second cell is oriented in a direction different from the first direction, and adjacent ones of said cells are in contact with each other;
a first insulative layer on said cells and said semiconductor substrate;
first wiring layers on said first insulative layer and selectively connected to said signal terminals and said power source terminals of said cells;
a second insulative layer on said first insulative layer and said first wiring layers; and
second wiring layers on said second insulative layer, said second wiring layers being selectively connected to said first wiring layer and said signal terminals and power source terminals of said cells via through holes defined by said second insulative layer.

2. A semiconductor integrated circuit comprising:
a plurality of cells, each cell including standard circuits having no power source line and no ground line and having a signal terminal coupled to a signal terminal of another cell, and a power source terminals connected to a power source, each cell being oriented and located to reduce a distance between the signal terminal and the signal terminal of the other cell, wherein a first cell is oriented in a first direction and a second cell is oriented in a direction different from the first direction, and adjacent ones of said cells are in contact with each other; and
a plurality of wiring layers for selectively connecting said signal terminals together and said power source terminals together, said wiring layers being insulated from said cells and arranged above said cells.

3. A circuit according to claim 2, further including
a first insulative layer on said cells and said semiconductor substrate; and
a second insulative layer on said first insulative layer and said first wiring layers, wherein said plurality of wiring layers includes at least first and second wiring layers, said first wiring layers being on the first insulative layer, said second wiring layers being formed on the second insulative layer, and said first and second wiring layers being connected to each other via through holes defined by said second insulative layer.

4. A semiconductor integrated circuit comprising:
a plurality of cells, each cell including standard circuits having a signal terminal coupled to a signal terminal of another cell and power source terminals connected to a power source, each cell being oriented and located to reduce a distance between the signal terminal and the signal terminal of the other cell, wherein a first cell is oriented in a first direction and a second cell is oriented in a direction different from the first direction; and
a plurality of wiring layers for selectively connecting said signal terminals together and said power source terminals together, said wiring layers being insulated from said cells and arranged above said cells.

5. A circuit according to claim 4, wherein adjacent ones of said cells are in contact with each other.

6. A circuit according to claim 4, wherein said wiring layers for connecting said power source terminals together have varying widths corresponding to different amounts of current.

7. A circuit according to claim 4, further including
a first insulative layer on said cells and said semiconductor substrate; and
a second insulative layer on said first insulative layer and said first wiring layers, wherein said plurality of wiring layers includes at least first and second wiring layers, said first wiring layers being on said first insulative layer, said second wiring layers being formed on said second insulative layer, and said first and second wiring layers being connected to each other via through holes defined by said second insulative layer.

8. A semiconductor integrated circuit, comprising:
a semiconductor substrate;
at least three cells, each cell including standard circuits having no power source line and no ground line and having a signal terminal coupled to a signal terminal of another cell, and power source terminals connected to a power source, each cell being oriented and located to reduce a distance between the signal terminal and the signal terminal of the other cell, wherein a first cell is oriented in a first direction and a second cell is oriented in a direction different from the first direction, and adjacent ones of said cells are in contact with each other;
a first insulative layer on said cells and said semiconductor substrate;
first wiring layers on said first insulative layer and selectively connected to said signal terminals and said power source terminals of said cells;
a second insulative layer on said first insulative layer and said first wiring layers; and
second wiring layers on said second insulative layer, said second wiring layers being selectively connected to said first wiring layer and said signal terminals and power source terminals of said cells via through holes defined by said second insulative layer.

9. A semiconductor integrated circuit comprising:
at least three cells, each cell including standard circuits having no power source line and no ground line and having a signal terminal coupled to a signal terminal of another cell, and power source terminals connected to a power source, each cell being oriented and located to reduce a distance between the signal terminal and the signal terminal of the other cell, wherein a first cell is oriented in a first direction and a second cell is oriented in a direction different from the first direction, adjacent ones of said cells being in contact with each other; and
a plurality of wiring layers for selectively connecting said signal terminals together and said power source terminals together, said wiring layers being insulated from said cells and arranged above said cells.

10. A semiconductor integrated circuit comprising:
at least three cells, each cell including standard circuits having a signal terminal coupled to a signal terminal of another cell and power source terminals connected to a power source, each cell being oriented and located to reduce a distance between the signal terminal and the signal terminal of the other cell, wherein a first cell is oriented in a first direction and a second cell is oriented in a direction different from the first direction; and
a plurality of wiring layers for selectively connecting said signal terminals together and said power source terminals together, said wiring layers being insulated from said cells and arranged above said cells.

* * * * *